(12) United States Patent
Winter et al.

(10) Patent No.: US 11,035,907 B2
(45) Date of Patent: Jun. 15, 2021

(54) SYSTEM AND METHOD FOR LOCATING EARTH FAULT IN POWER GRIDS

(71) Applicant: Swedish Neutral AB, Kungsängen (SE)

(72) Inventors: Klaus Winter, Kungsängen (SE); Andreas Winter, Stockholm (SE)

(73) Assignee: Swedish Neutral AB, Kungsängen (SE)

(*) Notice: Subject to any disclaimer, the term of this patent is extended or adjusted under 35 U.S.C. 154(b) by 168 days.

(21) Appl. No.: 16/303,420

(22) PCT Filed: May 16, 2017

(86) PCT No.: PCT/SE2017/050506
§ 371 (c)(1),
(2) Date: Nov. 20, 2018

(87) PCT Pub. No.: WO2017/200469
PCT Pub. Date: Nov. 23, 2017

(65) Prior Publication Data
US 2019/0137559 A1 May 9, 2019

(30) Foreign Application Priority Data
May 20, 2016 (SE) .................................. 1650686-7

(51) Int. Cl.
*G01R 31/52* (2020.01)
*G01R 31/08* (2020.01)
(Continued)

(52) U.S. Cl.
CPC ........... *G01R 31/52* (2020.01); *G01R 31/085* (2013.01); *G01R 31/086* (2013.01); *H02H 9/08* (2013.01);
(Continued)

(58) Field of Classification Search
CPC ........ H02H 1/0007; H02H 1/003; H02H 3/04; H02H 3/042; H02H 3/10; H02H 3/105;
(Continued)

(56) References Cited

U.S. PATENT DOCUMENTS 5,661,664 A * 8/1997 Novosel ................. H02H 3/402
324/512
6,573,726 B1 6/2003 Roberts et al.
(Continued)

FOREIGN PATENT DOCUMENTS

CN 105137285 A 12/2015
EP 1307753 B1 10/2005
(Continued)

OTHER PUBLICATIONS

International Search Report for corresponding Patent Application No. PCT/SE2017/050506 dated Aug. 11, 2017.
(Continued)

*Primary Examiner* — Alex Torres-Rivera
*Assistant Examiner* — David A. Singh
(74) *Attorney, Agent, or Firm* — Renner, Otto, Boisselle & Sklar, LLP

(57) ABSTRACT

In a multi-phase power grid fed by a power source, earth fault (460) is located by means of a power supply source synchronized with the power grid, which is connected between a zero point of the grid and earth. In a fault current compensation mode (420), a control unit controls the alternating voltage source to compensate for any ground fault current in the power grid to a value below a threshold level. In a fault detecting mode (430), the control unit gradually adjusts the output voltage of the alternating voltage source with respect to amplitude and/or phase angle (440). A change of zero-sequence current and zero-sequence admittance between the alternating voltage source and a fault
(Continued)

location is measured (450) by means of at least one detector. The at least one detector is communicatively connected to the control unit and reports recorded measured values representing zero-sequence current and/or zero-sequence admittance to the control unit. In the fault detecting mode, the control unit localizes a ground fault (460) based on at least one of said measurement values representing changes of the zero-sequence current and/or zero-sequence admittance, upon which an affected branch is disconnected (470) or the system switches to the fault compensation mode (420).

8 Claims, 3 Drawing Sheets

(51) Int. Cl.
| | |
|---|---|
| *H02H 9/08* | (2006.01) |
| *H02H 1/00* | (2006.01) |
| *H02H 3/17* | (2006.01) |
| *H02H 3/04* | (2006.01) |
| *H02H 7/28* | (2006.01) |

(52) U.S. Cl.
CPC ............ *H02H 1/003* (2013.01); *H02H 3/042* (2013.01); *H02H 3/17* (2013.01); *H02H 7/28* (2013.01)

(58) Field of Classification Search
CPC ............ H02H 3/167; H02H 3/17; H02H 7/26; H02H 7/268; H02H 7/28; H02H 9/08; G01R 31/00; G01R 31/08; G01R 31/081; G01R 31/083; G01R 31/085; G01R 31/086; G01R 31/50; G01R 31/52
USPC ...................................... 361/42, 47
See application file for complete search history.

(56) References Cited

U.S. PATENT DOCUMENTS

| | | | | |
|---|---|---|---|---|
| 2006/0097728 A1* | 5/2006 | Saha | ...................... | H02H 3/385 |
| | | | | 324/525 |
| 2006/0125486 A1* | 6/2006 | Premerlani | .......... | G01R 31/086 |
| | | | | 324/512 |
| 2008/0297163 A1* | 12/2008 | Wahlroos | ............. | G01R 31/088 |
| | | | | 324/522 |
| 2010/0046125 A1* | 2/2010 | Husband | ................ | H02H 9/021 |
| | | | | 361/19 |
| 2011/0075304 A1* | 3/2011 | Hamer | ................... | H02H 7/263 |
| | | | | 361/47 |
| 2011/0178741 A1* | 7/2011 | Saha | .................... | G01R 31/088 |
| | | | | 702/59 |
| 2011/0298468 A1* | 12/2011 | Wahlroos | ............. | G01R 31/086 |
| | | | | 324/509 |
| 2015/0346266 A1* | 12/2015 | Dimino | ................ | G01R 31/086 |
| | | | | 702/59 |
| 2016/0061873 A1* | 3/2016 | Liu | ........................ | G01R 31/50 |
| | | | | 702/59 |

FOREIGN PATENT DOCUMENTS

| | | | | |
|---|---|---|---|---|
| RU | 2505825 C2 | 1/2014 | | |
| WO | 2002/015355 A2 | 2/2002 | | |
| WO | WO-0215355 A2 * | 2/2002 | ............. | H02H 1/00 |
| WO | 2014/021773 | 2/2014 | | |
| WO | 2014/194941 A1 | 12/2014 | | |

OTHER PUBLICATIONS

Chinese Office Action for corresponding Chinese Patent Application No. 201780031269.8 dated May 28, 2019, with translation.
English translation of Russian Office Action and Search Report for corresponding Russian Patent Application No. 2018145025 dated Jun. 30, 2020.

* cited by examiner

SYSTEM AND METHOD FOR LOCATING EARTH FAULT IN POWER GRIDS

BACKGROUND OF THE INVENTION AND PRIOR ART

The present invention generally relates to solutions for compensating earth fault currents in a multiphase power grid. In particular, the invention relates to a system for locating earth fault according to the preamble of claim 1 and a corresponding method. The invention also relates to a computer program and a process-readable medium.

There are today technical solutions to quickly and fully compensate for a fault current at earth fault in a high voltage grid. For example, the applicant has designed a system which can eliminate any error current in less than 60 mils without influencing the power transfer by the malfunctioning device part. Such a quick intervention is of course advantageous as it significantly reduces the risk of consequential damage, such as short circuits, burns and/or personal injuries.

WO 2014/021773 discloses a solution in which a controllable grounding transducer is arranged to compensate for a residual operating current in a grounding fault of an alternating voltage power supply network with a power supply transformer. A primary winding of the grounding transformer is coupled to the power grid and a secondary coil of the grounding transformer is coupled between a zero point of the power grid and ground, the grounding transformer comprising two or more winding couplers and a control unit which via the winding couplers controls the secondary voltages of the grounding transformer with amplitudes and phase angles relative to the voltage signal of the power supply transformer.

Problem with Previously Known Techniques

One disadvantage of a very fast intervention is that the possibility of locating the actual fault location is severely limited. Because for regulatory reasons, it is often required that a possible fault current can be rapidly reduced to zero, or near zero, there is still no method available for locating the fault location caused the error current. For example, the fault current should not exceed a threshold value which is typically significantly lower than the current that occurs if supply voltage would be applied to detect a possible error. The post locating thus risks causing spark formation which in turn may cause, for example, forest fire. Therefore, with the methods known to date, it is impossible to determine in a safe way whether the error was de facto transient, as is often the case in overhead line network, or if the error is of permanent nature.

SUMMARY OF THE INVENTION

The object of the invention is therefore to solve the above-mentioned problem, thus providing a means of locating any earth fault in a multiphase power grid while satisfying the current requirements by solving the elimination of fault currents in a reliable and rapid manner.

According to one aspect of the invention, the object of the initially described system is achieved, the system comprising at least one detector arranged in the power grid and communicatively connected to the control unit. The at least one detector is capable of registering the measurement values representing zero-sequence current and zero-sequence admittance. In a fault detection mode, the control unit is configured to gradually adjust an output voltage from the alternating voltage source with respect to amplitude and/or phase angle so that one of the changed zero-sequence current and zero-sequence admittance between the alternating voltage source and a fault location may be measured by the at least one detector. The at least one detector is in turn configured to apply registered measured values representing zero-sequence current and/or zero-sequence admittance to the control unit. In the fault detection mode, the control unit is further configured to detect a ground fault based at least on the measurement values representing changes of the zero-sequence current and/or zero-sequence admittance.

This system is advantageous because it makes it possible to find a fault location without risking exceeding a maximum power current at the fault location. It is unproblematic to allow the control unit to adjust the voltage of the alternating voltage source so that its output current in the fault detection mode is lower than a certain threshold, say 0.5 A. This current is the limit of post-localization of earth fault in the areas of Australia that is particularly sensitive to forest or grass fires.

According to a preferred embodiment of this aspect of the invention, the control unit is configured to switch to the fault compensation mode after fault detection mode. Consequently, power transmission via the malfunctioning device part can continue until the exact location of the fault location has been established and the necessary resources for repairing the fault have been developed.

According to another preferred embodiment of this aspect of the invention, the control unit, in the fault detection mode, is configured to control the alternating voltage source to output an alternating voltage in the power grid, which alternating voltage is superposed the voltage of the power grid and is gradually changing and whose frequency differs from a frequency of the power grid. This facilitates the detection of earth fault through the at least one detector.

It is particularly preferred if the control unit is configured to control the alternating voltage source to output an alternating voltage with a specific superimposed signal pattern and if the at least one detector is configured to detect the specific signal pattern. Thus, some types of earth faults can be detected and localized even more effective.

According to another aspect of the invention, the object of the above-described method is achieved, wherein measured values will be registered that represent zero-sequence current and zero-sequence admittance by means of at least one detector arranged in the power grid, and in a fault detection mode. A voltage output from the alternating voltage source is gradually adjusted with respect to amplitude and/or phase angle so that a change of zero-sequence current and zero-sequence admittance between the alternating voltage source and a fault can be measured using the at least one detector. On the basis of one of the measured values representing a change of zero-sequence current and/or zero-sequence admittance, a possible earth fault is detected. The advantages achieved by this method, as well as with the preferred embodiments thereof, are apparent from the discussion above with reference to the proposed system.

According to a further aspect of the invention, the object is achieved by a software program which is loadable to the memory of at least one processor, wherein the computer program comprises software for executing the above suggested method when the computer program is running in the at least one processor.

According to another aspect of the invention, the object is achieved by a computer readable medium having a program stored therein, the program being configured to cause at least one processor to execute the above suggested method when the program is loaded in the at least one processor.

Further advantages, advantageous features and applications of the present invention will be apparent from the following description and the dependent claims.

BRIEF DESCRIPTION OF THE DRAWINGS

The invention will now be explained in more detail by means of embodiments, which are shown by way of example, with reference to the accompanying drawings.

DESCRIPTION OF PREFERRED EMBODIMENTS OF THE INVENTION

Figure 1:
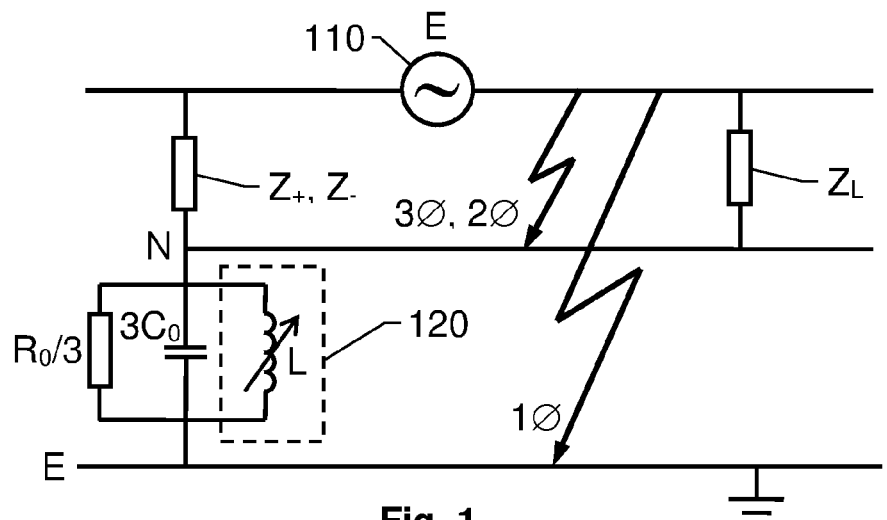
FIG. 1 illustrates a first prior art solution for resonance grounding.

Initially, reference is made to FIG. 1, which illustrates a first-mentioned known solution for so-called resonance grounding in a multi-phase power grid. FIG. 1 shows a transformation of the power grid to its symmetric component. The power grid here includes a power source 110 which supplies a driving voltage E to the power grid and source impedances $Z_+$, $Z_-$ and $Z_0$ and also a payload $Z_L$ in the power grid.

If earth fault occurs in the form of a single phase grounding 1Ø the fault current can be reduced by means of a zero-point reactor 120 connected between the zero point N and the ground E. The zero-point reactor 120 is a variable inductance L which forms a parallel resonance circuit with the capacitance leakage current $3C_0$ of the power grid. On the one hand, transfer of the payload $Z_L$ must be limited to a plus- and minus-sequence system, that is, between the faults; and on the other hand, the zero-point reactor 120 must be capable of matching the varying leakage currents that occur in the power grid during operation.

The basic prerequisite for limiting the power transmission to the plus sequence and the minus sequence is given in the vast majority of existing power grids. Resonance grounding is today the predominant system of the existing high-voltage distribution networks.

An immediate effect of current limitation at single phase landings 1Ø is that light arc overlays, which are the most frequent errors in overhead line network, are self-sealed. The zero-point reactor 120 is therefore also called extinguishing coil, or Petersen coil after inventor Waldemar Petersen.

At ground fault, zero-point reactor 120 compensates for the capacitive leakage currents. The resistive leakage currents remain without compensation, and the resistive leakage currents usually represent 5-10% of the total earth fault current.

As more and more overhead line networks are replaced by buried cables, the capacitive leakage currents of the power grid generally increase. This also increases resistive leakage currents in power grids. As a consequence, the uncompensated resistive residual currents also increase, which in turn risks exposing the self-extinguishing function in that part of the power grid that still includes overhead line networks. For security reasons, this is of course unacceptable.

Figure 2:
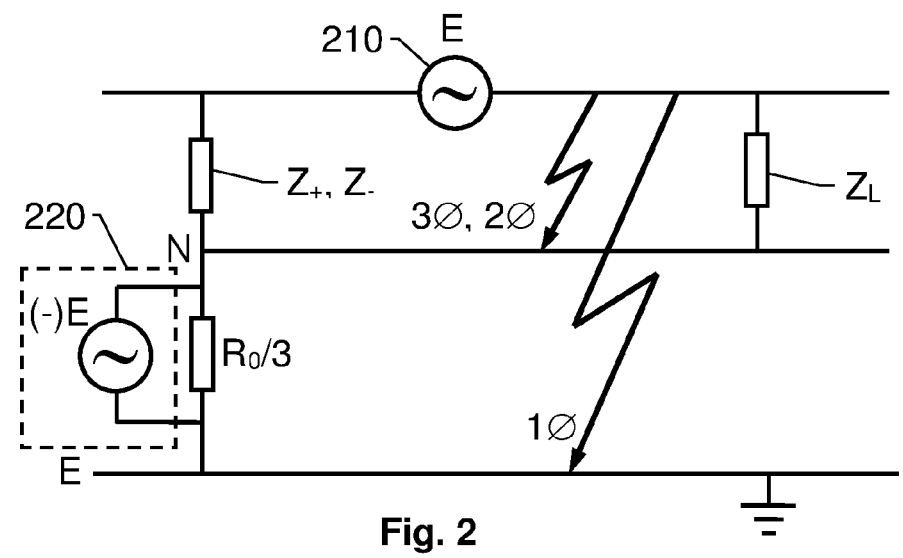
FIG. 2 illustrates a second prior art residual current compensation solution.

FIG. 2 illustrates a second prior art solution for residual current compensation, which is a further development of the structure of FIG. 1. The now tuned parallel resonance circuit $3C_0//L$ has here been omitted for the sake of clarity.

In analogy with FIG. 1, FIG. 2 shows a driving voltage E from a power source 210, source impedances $Z_+$, $Z_-$ and $Z_0$ and a payload $Z_L$. In addition, a residual current compensation device 220 is included, which in turn includes a voltage source (−) E which is synchronized with the power grid, which injects a compensation current between the zero point and ground of the power grid, which compensating current is equal to the residual current, but phase distorted 180° relative to a phase angle of the residual current. The voltage source (−)E of the residual current compensation device 220 is parallel to the sum of the resistive currents $R_0/3$ of the power grid. Then, as mentioned above, the known solutions do not allow a localization of a fault location during residual current compensation while meeting the regulatory requirements for maximum current strength, the invention aims at solving this problem.

Figure 3:
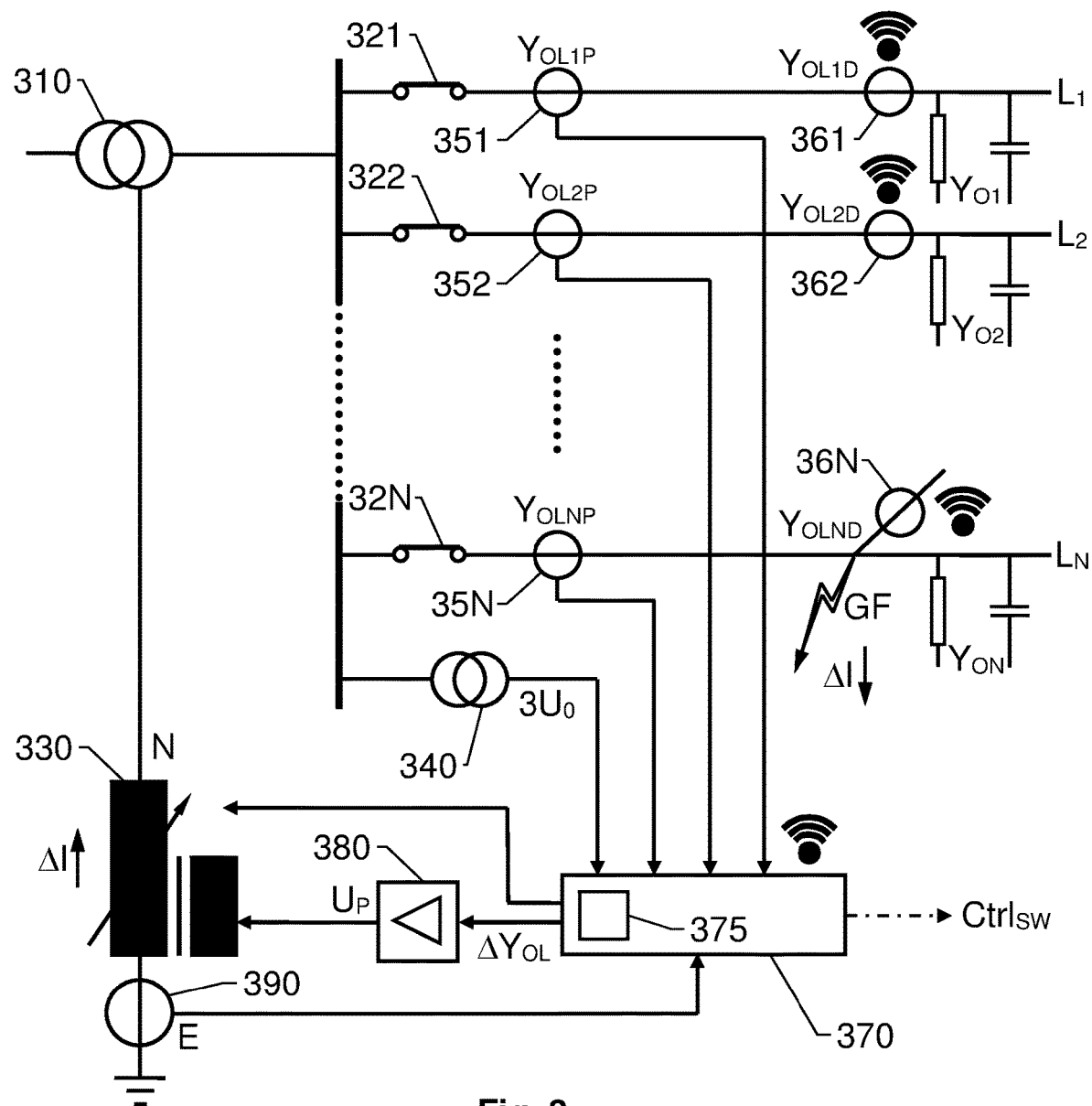
FIG. 3 shows a single-line diagram according to one embodiment of the invention for locating earth fault.

FIG. 3 shows a single-line diagram according to one embodiment of the invention for locating earth fault in a multi-phase power grid.

In general terms, the proposed methodology assumes that once an error has been detected and the earth fault current has been compensated according to the above described with reference to FIG. 2, the voltage/current of the assumed fault location gradually increases while appropriate parameters are measured in the power grid. In this fault detection mode, the same alternating voltage source is used, which is used for residual current compensation in a fault current compensation mode.

More specifically, in the fault detection mode, a fault localization signal is superimposed by means of the power supply (−)E for residual current compensation. A relationship between current and voltage in the fault location is determined by an initially unknown fault impedance, together with a source impedance of a fault circuit. In order to ensure that the current resulting from the localization signal does not exceed given limits, the voltage of the localization signal is gradually increased until the fault location is determined by means of specifically adapted detectors, alternatively until a maximum voltage level has been achieved, whichever occurs first.

In FIG. 3, the multiphase power grid is fed by a power source 310. The system proposed according to the invention comprises a power grid synchronized alternating voltage source 380 which is connected between a zero point N of the grid and ground E.

The system also includes a control unit 370 which is capable of controlling the alternating voltage source 380 in a fault current compensation mode to compensate for any ground fault current $\Delta I$ in a resonance grounded power grid to a value underlying a threshold level. Further, a three-phase measurement transformer 340 is connected to the controller 370, which three-phase measurement transformer 340 is configured to measure a zero-sequence voltage $3U_0$ to determine if ground fault exists in the power grid.

The system further includes at least one detector, here exemplified by 351, 352, 35N, 361, 362 and 36N, which detector is arranged in the power grid and communicatively connected to the control unit 370. The at least one detector 351, 352 35N, 361, 362 and/or 36N are further configured to register the measurement values $Y_{OL1P}$, $Y_{OL1D}$, $Y_{OL2P}$, $Y_{OL2D}$, $Y_{OLNP}$, and $Y_{OLND}$ representing zero-sequence current and zero-sequence admittance, so that these parameters can be reported to the control unit 370.

During current residual current compensation, the fault detection mode can be activated automatically, or in response to a command to the control unit 370, which command has been generated by an operator of the power grid.

In the fault detection mode, the control unit 370 is configured to progressively adjust an output voltage Up from the alternating voltage source 380 with respect to amplitude and/or phase angle so that a zero-sequence current and/or a zero-sequence admittance between alternating voltage source 370 and a possible fault location changes.

The at least one of the detectors 351, 352, 35N, 361, 362 and/or 36N registers the measurement values $Y_{OL1P}$, $Y_{OL1D}$, $Y_{OL2P}$, $Y_{OL2D}$, $Y_{OLNP}$ and $Y_{OLND}$ representing zero-sequence current and/or zero-sequence admittance and transfers these measurement values $Y_{OL1P}$, $Y_{OL1D}$, $Y_{OL2P}$, $Y_{OL2D}$, $Y_{OLNP}$, and $Y_{OLND}$ to the control unit 370.

In the fault detection mode, the control unit 370 is configured to localize a ground fault GF based on at least one of the measured values $Y_{OL1P}$, $Y_{OL1D}$, $Y_{OL2P}$, $Y_{OL2D}$, $Y_{OLNP}$, and $Y_{OLND}$ representing zero-sequence current and/or zero-sequence admittance from the at least one detector 351, 352, 35N, 361, 362 and/or 36N. At the same time, by measuring a current in a grounding 390 of a zero point reactor 330, the control unit 370 checks that a change of current ΔI does not exceed a maximum allowable level.

Preferably, the control unit 370 is configured to switch to fault compensation mode after the fault detection mode has ended if a ground fault GF has been located. Alternatively, the associated branch conductor line, such as $L_N$ in FIG. 3, may be disconnected from the power source 310. In FIG. 3 is shown current selector 321, 322 and 32N, which are arranged on a respective line $L_1$, $L_2$ and $L_N$, and are individually controllable from control unit 370 on the basis of a control signal $Ctrl_{SW}$.

If no earth fault is detected, the control unit 370 is preferably configured to disconnect the alternating voltage source 380.

According to a preferred embodiment of the invention, the control unit 370 in the fault detection mode is configured to control the alternating voltage source 380 to output an alternating voltage to the power grid, which (i) are superimposed the voltage of the power grid, (ii) is gradually changing and (iii) whose frequency differs from a frequency of the power grid. Accordingly, detection of the signal is facilitated by the at least one detector 351, 352, 35N, 361, 362 and/or 36N.

Particularly preferred is whether the control unit 370 is configured to control the alternating voltage source 380 to output an alternating voltage to the power grid with an superimposed signal pattern, and the at least one detector 351, 352, 35N, 361, 362 and/or 36N is specifically configured to detect this superimposed signal pattern.

It is generally preferred if the control unit 370 is configured to operate the above described procedure in a completely automatic manner, for example by executing a computer program in a processor. Therefore, the control unit 370 advantageously includes a memory device 375 which stores a computer program including software for executing the procedure when the program is running in the processor.

Figure 4:
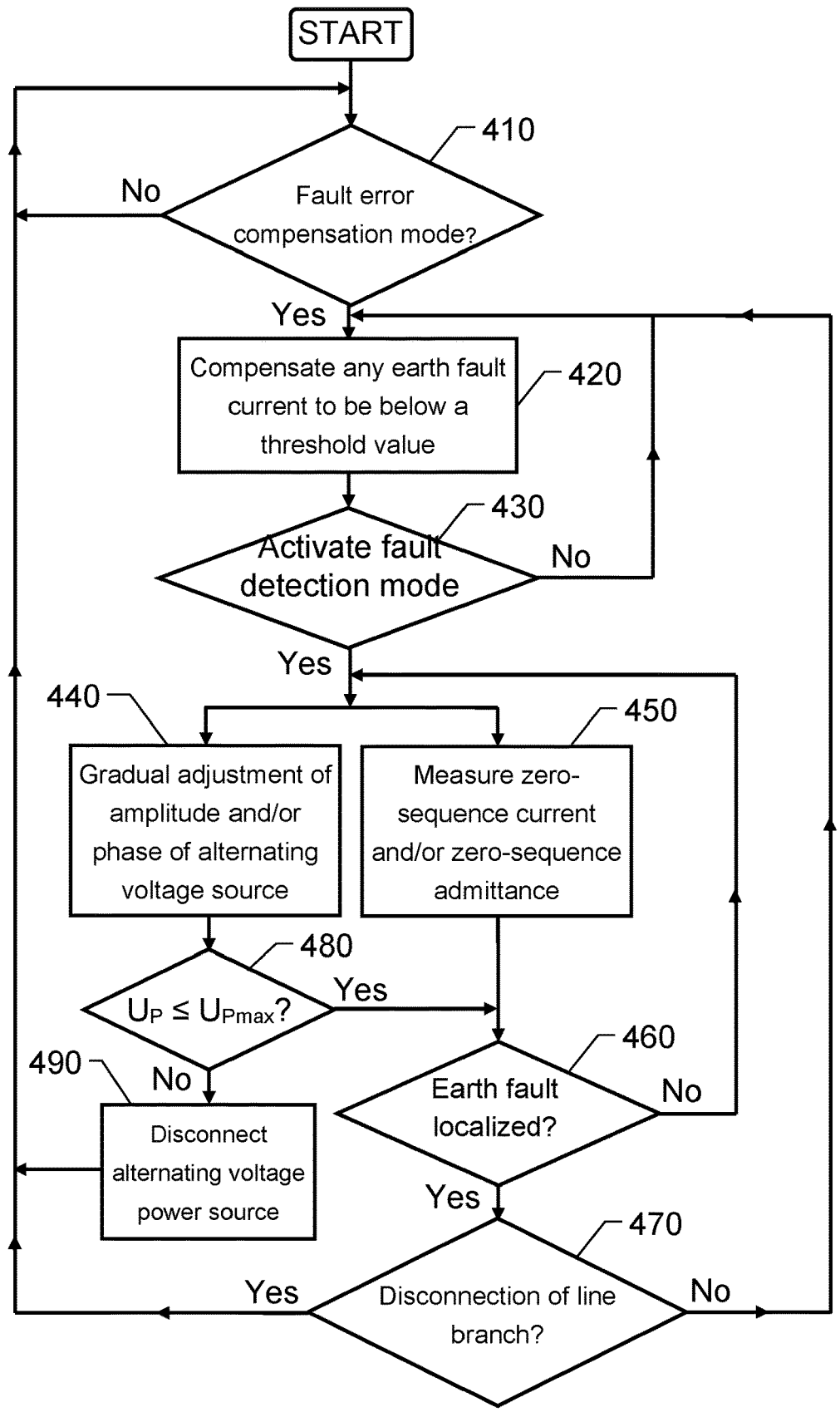
FIG. 4 illustrates, by means of a flowchart, a method according to an embodiment of the invention.

In order to summarize, and with reference to the flowchart of FIG. 4, we will now describe an embodiment of the method of the proposed invention.

In a first step 410, it is examined if a fault current compensation mode is to be applied. If this is not the case, the procedure loops and stops at step 410. If in step 410 an earth fault has been detected, a step 420 follows in which compensation is made for an earth fault current so that the earth fault current is below a threshold. Then a step 430 follows.

In step 430, it is checked if a fault detection mode is to be activated. If this is not the case, the procedure loops back to step 420 for continued compensation of ground fault current. If at step 430 it is found that the fault detection mode is to be activated, steps 440 and 450 are activated, preferably parallel to each other.

In step 440, the alternating voltage source is controlled to gradually adjust an output voltage from the alternating voltage source with respect to amplitude and phase angle so as to result in a zero-sequence current and zero-sequence admittance between the alternating voltage source and a fault location is changed.

At step 450, a zero-sequence current and/or a zero-sequence admittance between the alternating voltage source and the fault location is measured by means of specifically adapted detectors mounted in the power grid.

After step 440, a step 480 follows, where it is checked whether the output voltage Up from the alternating voltage source is lower than or equal to a maximum allowed value $U_{Pmax}$. If so, the procedure proceeds to a step 460, and otherwise a step 490 follows.

After step 450 follows a step 460 where it is investigated if a ground fault has been detected by the measurements in step 450. If so, a step 470 follows, and otherwise the loop proceeds back to steps 440 and 450 for continued fault localization.

At step 470, it is checked if the line branch affected by the ground fault should be disconnected; and if so, disconnection of the affected line branch occurs, the procedure proceeds to step 410. Otherwise, the procedure returns to step 420.

At step 490, the alternating voltage source is disconnected. Then the procedure returns to step 410.

The above described steps, as well as any random sequence thereof described with reference to FIG. 4 can be controlled by a programmed processor. In addition, although the above-described embodiments of the invention, with reference to the figures, comprise a computer and computer-implemented processes, the invention extends to particularly, on a carrier or in a carrier, being adapted to practically implement the invention. The program may be in the form of source code, object code, a code that represents an intermediate between source- and object-code, as in a partially compiled form, or in any other form appropriate to use upon the implementation of the present invention. The carrier may be any entity or device capable of carrying the program. For example, the carrier may comprise a storage medium such as a flash memory, a ROM (Read Only Memory), for example, a CD (Compact Disc) or a Semiconductor ROM, EPROM (Electrically Programmable ROM), EEPROM (Erasable EPROM), or a magnetic recordable medium, for example, a floppy or hard disk. In addition, the carrier may be an overloaded carrier such as an electrical or optical signal which can be passed through an electrical or optical cable or via radio or by other means. When the program is made up of a signal that can be directed directly by a cable or other device or member, the carrier may be such a cable, device or member. Alternatively, the carrier may be an integrated circuit in which the program is embedded, wherein the integrated circuit is adapted to perform, or to be used in carrying out the relevant processes.

The invention is not limited to the embodiments described with reference to the figures but can be varied freely within the scope of the appended claims.

The term "includes/including" when used herein, this term is understood to refer to the presence of the specified features, integers, steps or components. However, the term does not exclude the presence or addition of one or more additional features, integers, steps or components, or groups thereof.

The invention claimed is:

1. A system for locating earth fault in a multi-phase power grid powered by a power source, the system comprising:
   an alternating voltage source synchronized with the power grid and which is connected between a zero point of the power grid and earth;
   a controller configured to control the alternating voltage source when in a fault current compensation mode to compensate for an earth fault current to maintain the earth fault current at a value below a threshold level; and
   at least one detector arranged in the power grid and communicatively connected to the controller, the at least one detector being configured to determine measurement values representing zero-sequence current and zero-sequence admittance,
   wherein the controller, when in a fault detection mode, is configured to gradually adjust a voltage from the alternating voltage source with respect to amplitude and/or phase angle so that a change of zero-sequence current and zero-sequence admittance between the alternating voltage source and a localization point can be measured by the at least one detector,
   wherein the at least one detector is configured to send the determined measurement values representing zero-sequence current and/or zero-sequence admittance to the controller,
   wherein the controller, when in the fault detection mode, is configured to localize an earth fault based on at least one of said measurement values representing changes of zero-sequence current and/or zero-sequence admittance, and
   wherein the controller is configured to switch to the fault current compensation mode after the fault detection mode, wherein the controller is configured to operate first in the fault detection mode and then in the fault current compensation mode that follows the fault detection mode.

2. The system of claim 1, wherein the controller, when in the fault detection mode, is configured to control the alternating voltage source to output an alternating voltage to the power grid, the alternating voltage gradually changing and having a frequency that differs from a frequency of the power grid.

3. The system of claim 1, wherein the controller is configured to control the alternating voltage source to output to the power grid an alternating voltage with an superimposed signal pattern, and the at least one detector is configured to detect the superimposed signal pattern.

4. A method of locating earth fault in a multiphase power grid fed by a power source using an alternating voltage source that is synchronized to the power grid, and which is connected between a zero point of the power grid and earth, the method comprising:
   controlling, in a fault current compensation mode of a controller, the alternating voltage source to compensate for an earth fault current in the power grid to maintain the earth fault current at a value below a threshold level;
   determining measurement values representing zero-sequence current and zero-sequence admittance using at least one detector arranged in the power grid;
   gradually adjusting an output voltage of the alternating voltage source with respect to amplitude and/or phase angle, when in a fault detection mode of the controller, so that a change of zero-sequence current and zero-sequence admittance between the alternating voltage source and a fault location can be measured with the at least one detector;
   localizing an earth fault based on at least one of said measurement values representing changes of zero-sequence current and/or zero-sequence admittance; and
   switching the controller into the fault current compensation mode after the fault detection mode, wherein the controller is configured to operate first in the fault detection mode and then in the fault current compensation mode that follows the fault detection mode.

5. The method of claim 4 further comprising controlling the alternating voltage source, when in the fault detection mode, to output an alternating voltage to the power grid, is the alternating voltage being gradually changeable and having a frequency that differs from a frequency of the power grid.

6. The method of claim 4, comprising:
   controlling the alternating voltage source to output an alternating voltage to the power grid having a superimposed signal pattern, and
   detecting the superimposed signal pattern by means of the at least one detector.

7. A computer program loadable into a memory of at least one processor, including software for executing the method of claim 4, when the computer program is running in the at least one processor.

8. A processor-readable non-transient medium having a program stored therein, wherein the program is arranged to cause at least one processor to execute the method of claim 4 when the program is loaded into the at least one processor.

* * * * *